US011825609B1

(12) United States Patent
Lavin et al.

(10) Patent No.: US 11,825,609 B1
(45) Date of Patent: Nov. 21, 2023

(54) HIGH RESOLUTION, HIGH CONDUCTIVITY COMPONENTS BY AEROSOL JET PRINTING

(71) Applicants: National Technology & Engineering Solutions of Sandia, LLC, Albuquerque, NM (US); UNM Rainforest Innovations, Albuquerque, NM (US)

(72) Inventors: Judith Maria Lavin, Albuquerque, NM (US); Lok-Kun Tsui, Albuquerque, NM (US)

(73) Assignees: National Technology & Engineering Solutions of Sandia, LLC, Albuquerque, NM (US); UNM Rainforest Innovations, Albuquerque, NM (US)

( * ) Notice: Subject to any disclaimer, the term of this patent is extended or adjusted under 35 U.S.C. 154(b) by 451 days.

(21) Appl. No.: 17/196,492

(22) Filed: Mar. 9, 2021

Related U.S. Application Data

(60) Provisional application No. 63/022,676, filed on May 11, 2020.

(51) Int. Cl.
*H05K 1/09* (2006.01)
*H05K 3/12* (2006.01)
*C09D 11/52* (2014.01)

(52) U.S. Cl.
CPC ............ *H05K 3/125* (2013.01); *C09D 11/52* (2013.01); *H05K 1/09* (2013.01); *H05K 2203/013* (2013.01)

(58) Field of Classification Search
CPC .......... H05K 1/09; H05K 1/092; H05K 1/095; H05K 1/097; H05K 3/125
See application file for complete search history.

(56) References Cited

U.S. PATENT DOCUMENTS

2009/0236627 A1* 9/2009 Kim ..................... H05K 3/1258
257/773

OTHER PUBLICATIONS

MICROFAB SC Technical Data Sheet, Ethone Inc. (2009) West Haven, Connecticut, 8 pages.

* cited by examiner

*Primary Examiner* — Jeremy C Norris
(74) *Attorney, Agent, or Firm* — Mark A. Dodd (57) ABSTRACT

Highly conductive electrical traces formed over mechanical steps or on non-planar surfaces with linewidths of 10 to 100 μm and a method for forming such electrical traces are disclosed. The method employs two steps, with the first step using an aerosol jet printing (AJP) process to form thin electrical traces that serve as the seed layers for the second step. The first step preferably employs multiple passes with the AJP to create multiple seed sub-layers with improved continuity and conductivity. In the second step, the seed layers are subjected to an electrodeposition process that forms the bulk of the thickness of the electrical traces. The electrodeposition process may include one, two, or three phases at corresponding low or high biases, with low biases providing denser, more highly conductive plating sub-layers, while high biases provide plating sub-layers having better gap bridging properties.

18 Claims, 10 Drawing Sheets

HIGH RESOLUTION, HIGH CONDUCTIVITY COMPONENTS BY AEROSOL JET PRINTING

RELATED APPLICATIONS

This application claims priority to U.S. Provisional Application No. 63/022,676, filed on May 11, 2020, and entitled HIGH RESOLUTION, HIGH CONDUCTIVITY COMPONENTS BY AEROSOL JET PRINTING, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to electrical traces and a method to form these electrical traces using an aerosol jet printing process followed by an electroplating process.

BACKGROUND

Electronic devices are now being fabricated using hybrid integration (HI), in which various portions of the overall electronic devices are formed using different technologies, but then must be integrated, frequently via electrical traces. Because the various portions of the overall electronic devices are formed using different technologies, mechanical steps may exist between the portions, for example, a first portion may be mounted on a second portion, resulting in a mechanical step equal to the thickness of the first portion plus the thickness of the mounting adhesive. In other electronic devices, the relevant surfaces may be concave or convex, yet the electrical traces must still conform to such non-planar surfaces. Thus, a need exists for electrical traces that can be formed over mechanical steps and on non-planar surfaces.

For a number of devices, including HI devices, the desired physical width of the electrical traces may be on the order of 10 to 100 µm. In addition, the electrical traces need to minimize signal loses between the various portions of the overall electronic devices. Thus, a need exists for highly conductive electrical traces having linewidths on the order of 10 to 100 µm.

Furthermore, electronic devices, or various portions thereof, are now being fabricated using additive manufacturing (AM). These AM-based electronic devices, like those fabricated using HI, require highly conductive electrical traces formed over mechanical steps or on non-planar surfaces, having 10 to 100 µm linewidths.

When using electrical traces to interconnect multiple electronic devices, the electronic devices may be translated or rotated from their expected positions. Thus, a need exists for a method to automatically generate a toolpath used to print an electrical trace taking into account potential translations or rotations of the electronic devices.

SUMMARY

One aspect of the present invention relates to highly conductive electrical traces formed over mechanical steps or on non-planar surfaces with linewidths of 10 to 100 µm.

Another aspect of the present invention relates to a two-step method for forming highly conductive electrical traces over mechanical steps or on non-planar surfaces with linewidths of 10 to 100 µm. In the first step of the method, thin electrical traces having linewidths in the range of 10 to 100 µm are printed using an aerosol jet printing process. In the second step of the method, the thin electrical traces from the first step serve as the seed layer for an electrodeposition process in which a thicker layer of conductive material is electrodeposited on the thin, seed layer electrical traces.

In at least one embodiment of the present invention, a device comprises an electrical trace, the electrical trace including a seed layer (the seed layer formed by an aerosol jet printing (AJP) process) and a plating layer (the plating layer formed by an electrodeposition process); the seed layer includes at least two seed sub-layers (each of the at least two seed sub-layers formed by a corresponding AJP process); the AJP process uses a conductive ink including one or more of silver, copper, or gold; the AJP process uses a conductive ink including silver; the electrodeposition process uses an electrolyte including one or more of silver, copper, nickel, or gold; and the electrodeposition process uses an electrolyte including copper.

In at least one embodiment of the present invention, a method for forming an electrical trace on a surface, the method comprises the steps of forming a seed layer on the surface (the seed layer formed using an aerosol jet printing (AJP) process) and forming a plating layer on the seed layer (the plating layer formed using an electrodeposition process); the seed layer includes at least two seed sub-layers (each of the at least two seed sub-layers formed by a corresponding AJP process); the AJP process uses a conductive ink including one or more of silver, copper, or gold; the AJP process uses a conductive ink including silver; the electrodeposition process uses an electrolyte including one or more of silver, copper, nickel, or gold; and the electrodeposition process uses an electrolyte including copper.

In various embodiments of the present invention, the plating layer includes a single plating sub-layer (the electrodeposition process forming the single plating sub-layer uses a voltage adapted to form a dense single plating sub-layer); the plating layer includes a single plating sub-layer (the electrodeposition process forming the single plating sub-layer uses a voltage adapted to form a gap bridging single plating sub-layer); the plating layer includes a first plating sub-layer and a second plating sub-layer (the second plating sub-layer formed on the first plating sub-layer), the electrodeposition process forming the first plating sub-layer uses a voltage adapted to form a dense first plating sub-layer, and the electrodeposition process forming the second plating sub-layer uses a voltage adapted to form a gap bridging second plating sub-layer; the plating layer includes a first plating sub-layer and a second plating sub-layer (the second plating sub-layer formed on the first plating sub-layer), the electrodeposition process forming the first plating sub-layer uses a voltage adapted to form a gap bridging first plating sub-layer, and the electrodeposition process forming the second plating sub-layer uses a voltage adapted to form a dense second plating sub-layer; and the plating layer includes a first plating sub-layer, a second plating sub-layer, and a third plating sub-layer (the second plating sub-layer formed on the first plating sub-layer, the third plating sub-layer formed on the second plating sublayer), the electrodeposition process forming the first plating sub-layer uses a voltage adapted to form a dense first plating sub-layer, the electrodeposition process forming the second plating sub-layer uses a voltage adapted to form a gap bridging second plating sub-layer, and wherein the electrodeposition process forming the third plating sub-layer uses a voltage adapted to form a dense third plating sub-layer.

In at least one embodiment of the present invention, a method for forming an electrical trace between two electronic devices, the method comprises the steps of providing a first electronic device and a second electronic device, determining a first translation and a first rotation of the first electronic device, determining a second translation and a second rotation of the second device, generating a first polygon corresponding to a first conductor area of the first electronic device, generating a second polygon corresponding to a second conductor area of the second electronic device, generating a third polygon connecting the first polygon to the second polygon, generating toolpath coordinates based upon a combination of the first polygon, the second polygon, and the third polygon, translating the toolpath coordinates, forming a seed layer based upon the thus translated toolpath coordinates (the seed layer formed using an aerosol jet printing (AJP) process), and forming a plating layer on the seed layer (the plating layer formed using an electrodeposition process).

In various embodiments of the present invention, each of the first electronic device and the second electronic device is an integrated circuit or a substrate; and the step of translating includes translating the toolpath coordinates from a first coordinate system into a format compatible with an aerosol jet printer employed in the step of forming the seed layer.

Features from any of the disclosed embodiments may be used in combination with one another, without limitation. In addition, other features and advantages of the present disclosure will become apparent to those of ordinary skill in the art through consideration of the following detailed description and the accompanying drawings.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
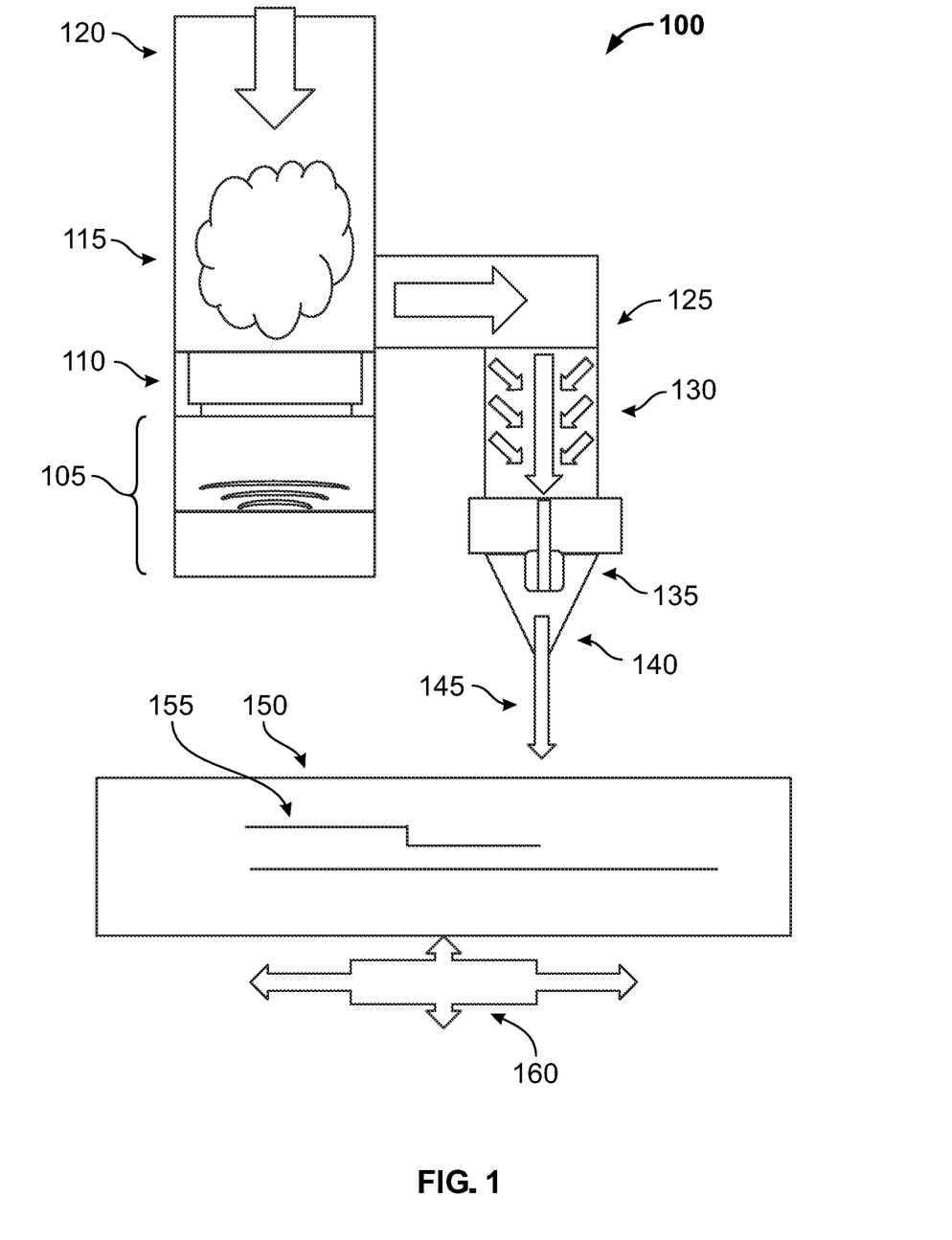
FIG. 1 illustrates an aerosol jet printer (AJP) that may be used in the first part of a printing process in accordance with one or more embodiments of the present invention.
Figure 2A:
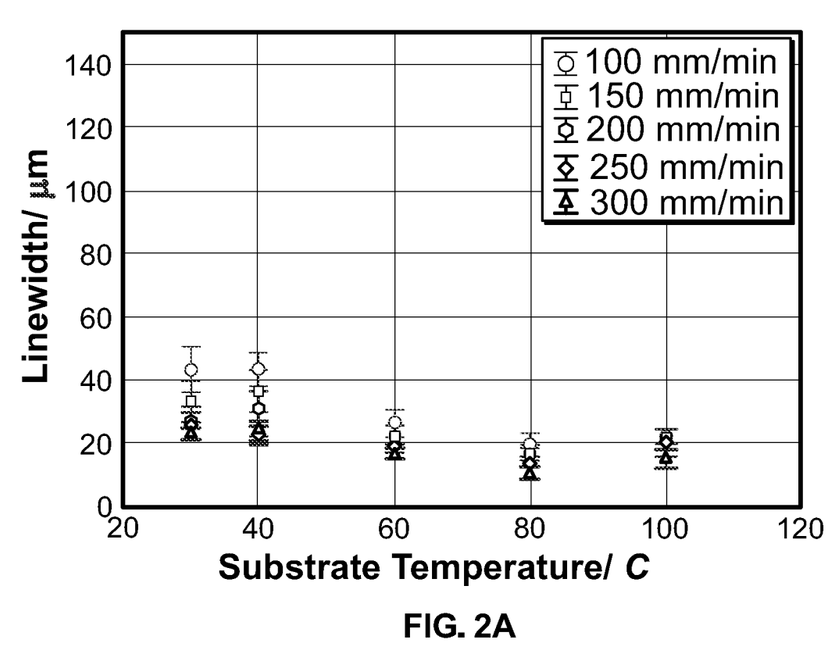
FIGS. 2A-2D illustrate measured linewidths as a function of substrate temperature for traces printed in accordance with one or more embodiments of the present invention.
Figure 2B:
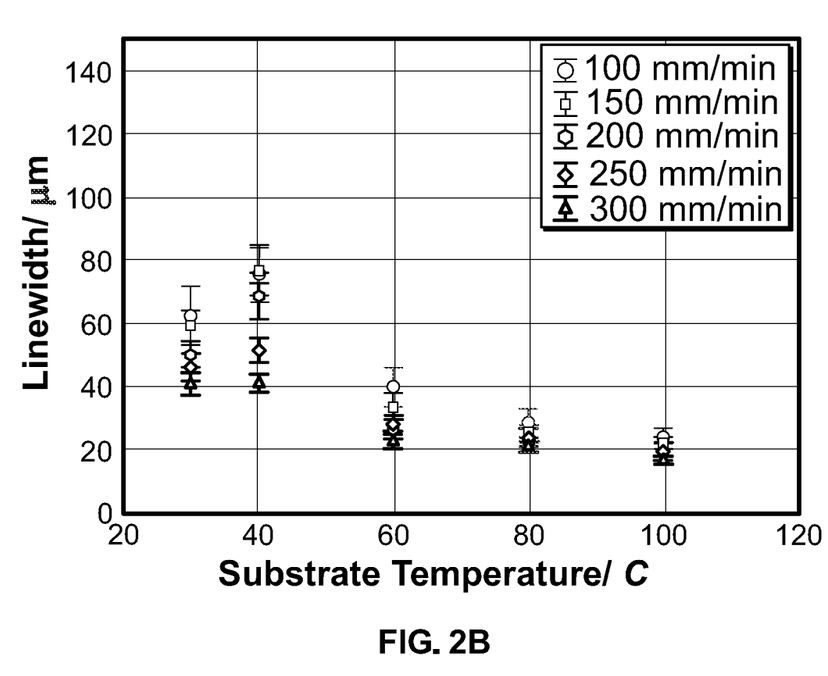
Figure 2C:
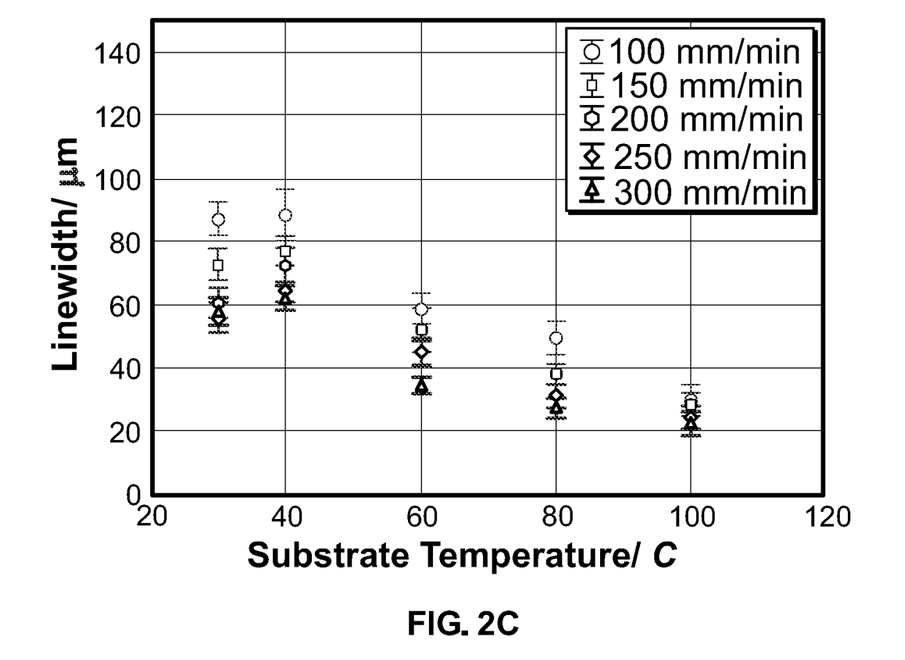
Figure 2D:
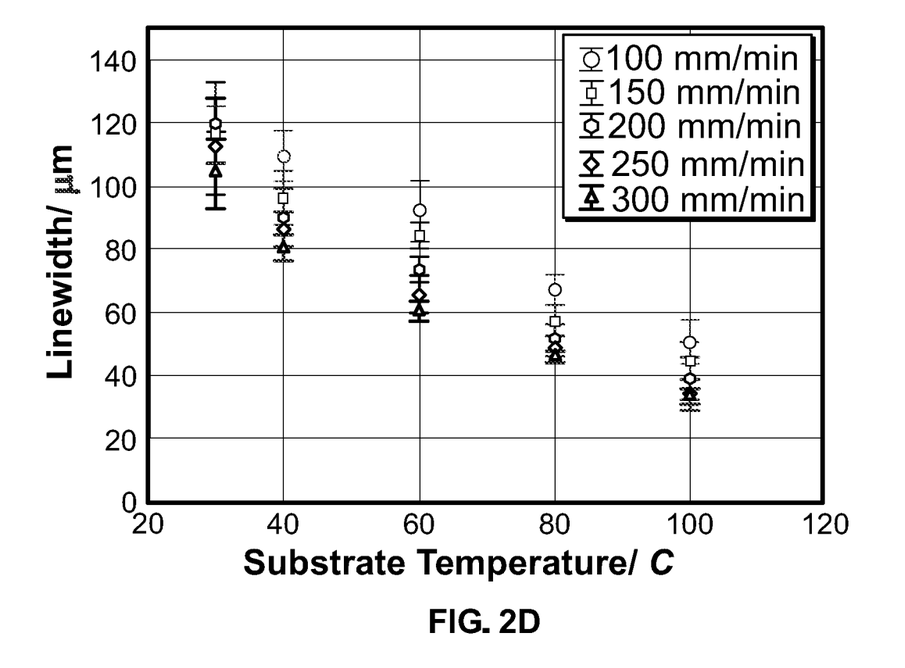

The first step of the two-step method to form highly conductive electrical traces over mechanical steps or on non-planar surfaces employs an aerosol jet printer (AJP) 100, as illustrated in FIG. 1. An exemplary AJP 100 is the "Nanojet" printer from Integrated Deposition Solutions. The AJP 100 includes an atomizer 105 for atomizing the ink 110. For successful atomization, the ink 110 preferably has a viscosity of less than 50 centipose (cP). The resulting ink mist 115 is transported by an aerosol gas 120. The ink mist 115 plus the aerosol gas 120 enters a chamber 125, where a sheath gas 130 is used to confine the radial dimension of the ink mist 115 plus aerosol gas 120. A focus lens 135 in the form of an orifice, further focusses the flow of the ink mist 115, aerosol gas 120, and sheath gas 130. The flow of the ink mist 115, aerosol gas 120, and sheath gas 130 exits the chamber 125 via a nozzle 140 as an ink stream 145. A substrate 150, upon which the desired electrical traces 155 will be formed, is located on a translation stage 160, which moves the substrate 150 with respect to the ink stream 145 in the X- and Y-directions. The motion of the translation stage 160 is controlled by a computer (not illustrated) using standard computer numerical control (CNC) software. While the fundamental width of the electrical traces 155 is 10 to 100 μm, wider electrical traces 155 can be printed using a serpentine path due to the flexibility of the CNC-controlled translation stage 160.

The atomizer 105 may be implemented in any suitable manner that creates the desired ink mist 115. The atomizer 105 may, for example, take the form of a jet nebulizer in which a stream of the aerosol gas 120 is forced through the ink 110. The atomizer 105 may alternatively employ ultrasonic waves to create the ink mist 115 that is subsequently transported by the aerosol gas 120. The atomizer 105 may also alternatively employ a vibrating mesh on the surface of the ink 110 that again generates the ink mist 115 that is subsequently transported by the aerosol gas 120. In yet other embodiments, the atomizer 105 may employ heat to evaporate the ink 110, thereby generating the ink mist 115 that is subsequently transported by the aerosol gas 120. From a cost standpoint, both the aerosol gas 120 and the sheath gas 130 are preferably room air.

The ink 110 may have any composition consistent with the desired highly conductive electrical traces, though silver-, copper-, and gold-bearing conductive inks are preferred. Note that the AJP 100 can be used to print a variety of materials, such that many different elements within a device may be formed by AM using a single tool. A magnetic core layer, such as might be used in an inductor, may be formed, for example, using a magnetite ($Fe_3O_4$)-containing ink. A dielectric layer may be formed, for example, using tetraethyl orthosilicate (TEOS). A ceramic layer, for example, alumina and zirconia, may be printed using aluminum- and zirconium-containing inks, respectively. Plastic material may be printed using various monomer- or polymer-containing inks.

As will be appreciated by those of ordinary skill in the art, the narrowest linewidth will be achieved when the focus of the ink stream 145 is located at approximately the surface of the substrate 150. If multiple different linewidths are required for a given application, this can readily be achieved by moving the location of the focus. In other words, by defocusing the ink stream 145 relative to the surface of the substrate 150, different linewidths can readily be achieved. This defocusing of the ink stream 145 may be achieved by employing a translation stage 160 that includes motion in the Z-(vertical) direction. The focus may also be adjusted by altering the pressure and/or flowrate of the sheath gas 130. As an example, the focusing ratio, defined as the ratio of the flow of the sheath gas 130 to the flow of the aerosol gas 120, may be changed. By increasing the focusing ratio, for example by increasing the flow of the sheath gas 130, the linewidth decreases. Typical focusing ratios are in the range of 2-8, though higher focusing ratios may be used for the narrowest electrical traces. Further, the width of the electrical trace 155 may be increased by printing a serpentine path with a narrower width ink stream 145.

As the minimum linewidth may be important for some applications of the present invention, the temperature of the substrate 150 during the printing process should be optimized. As typical ink formulations include both terpineol and xylenes, there are competing temperature processes. At higher temperatures, the viscosity of the terpineol decreases, which would increase the spreading and thus the minimum linewidth. In contrast, at higher temperatures the xylenes will evaporate faster, which would decrease spreading and thus the minimum linewidth. To study the effect of substrate 150 temperature on linewidth, an ink formulation of 20% UTDots Ag40x silver nanoparticle ink, 20% terpineol, and 60% xylenes on a volume basis was used. While the measured minimum linewidths were a function of the flowrate for the aerosol gas 120 and the speed of the CNC-controlled translation stage 160, the linewidths generally decreased as the substrate 150 temperature increased to 80° C. to 100° C., as illustrated in FIGS. 2A-2D. FIGS. 2A-2D correspond to aerosol gas 120 flow rates of 2.0 SCCM, 2.5 SCCM, 3.0 SCCM and 4.0 SCCM, respectively, while the sheath gas 130 flow rate was 40 SCCM in each case.

Figure 3:
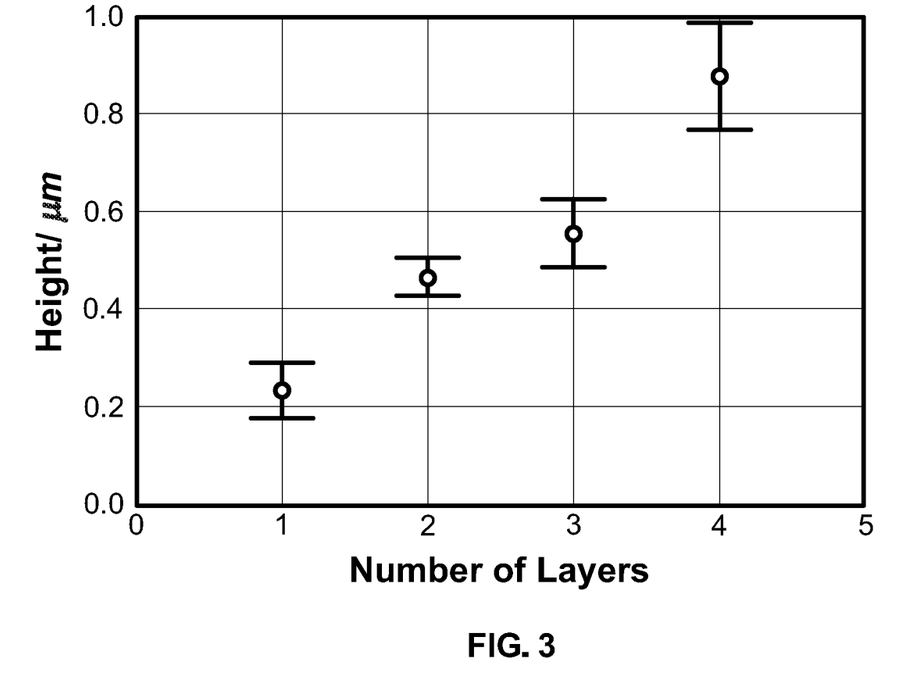
FIG. 3 illustrates the overall thickness of electrical traces printed by an AJP in the first part of a printing process in accordance with one or more embodiments of the present invention.

To reduce the resistance of the electrical traces printed by the AJP 100, multiple sub-layers, i.e., printing passes, may be used to increase the overall thickness (or height) of the printed electrical traces 155. As illustrated in FIG. 3, the overall thickness of the printed electrical traces 155 is a fairly linear function of the number of sub-layers, with the average thickness of each sub-layer for the given ink formulation being 0.20-0.25 μm. The ink formulation in this experiment was: 20% UTDots Ag40x silver nanoparticle ink, 20% terpineol, and 60% xylenes on a volume basis. The terpineol acted as a low volatility binder to fix the silver nanoparticles in place while the xylenes evaporated on the heated substrate 150 during and immediately after printing. The substrate 150 is preferably heated to a temperature in the range of 80° C. to 100° C. The printed electrical traces 155 are preferably furnace annealed in air at a temperature in the range of 175° C. to 225° C. for two to four hours.

Figure 4:
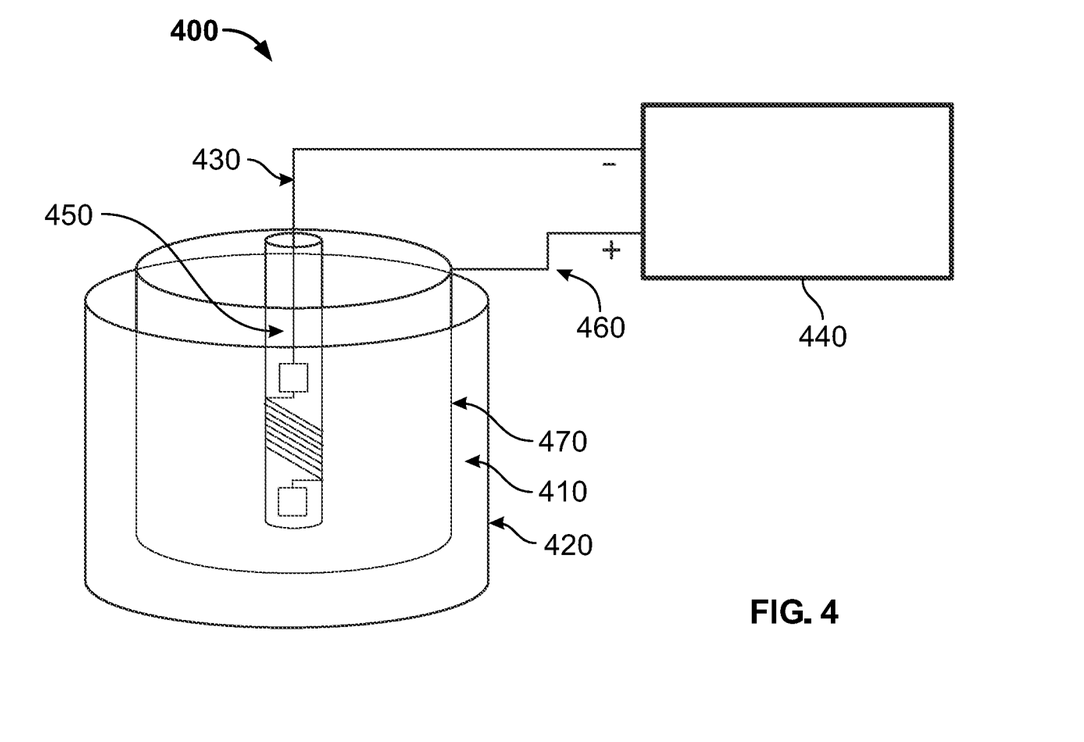
FIG. 4 illustrates the electrodeposition process in the second part of a printing process in accordance with one or more embodiments of the present invention.

The electrical traces 155 printed by the AJP 100 form the seed layers for the electrodeposition process, the second step of the two-step method for forming the highly conductive electrical traces in accordance with one or more embodiments of the present invention. The electrodeposition process 400, illustrated in FIG. 4, preferably employs a copper-based electrolyte solution 410 in a beaker 420. The copper-based electrolyte solution 410 results in a dense copper film, i.e., a plating layer, being formed on the seed layer using simple electrolytes. For example, the copper-based electrolyte solution 410 is preferably formed of 1M $CuSO_4$ and 0.3M $H_2SO_4$ in DI water, resulting in a $Cu^{2+}$ concentration of 15 to 20 g/L. While a silver-based electrolyte solution 410 could be used for the electrodeposition process 400, it requires additional complexing agents to form the desired dense silver film. In like manner, a gold-based electrolyte solution 410 could be used for the electrodeposition process 400, though it will be significantly more expensive than the copper-based electrolyte solution 410.

The electrodeposition process 400 includes connecting a first wire 430 to the negative terminal of the potentiostat 440 and to the seed layer on the device 450, thereby forming the cathode. A second wire 460 is connected to the positive terminal of the potentiostat 440 and to a tube of copper foil 470 surrounding the device 450, thereby forming the anode. The deposition rate of the electrodeposition process may be controlled by the bias supplied by the potentiostat 440. The greater the bias, the greater the deposition rate. As a greater thickness of the plating layer should increase the conductivity of the resultant electrical traces, a greater bias may be preferred. However, with a greater deposition rate comes a less dense plating layer, which will have a lower conductivity than a denser plating layer. Thus, one of ordinary skill in the art is left with an engineering tradeoff between an increased deposition rate and an increased density of the plating layer. While not illustrated in FIG. 4, a stir plate may optionally be used to stir the electrolyte solution 410 to ensure good circulation of the plating ions. Additional information regarding an exemplary electrodeposition process 400 may be found in "Microfab SC—Acid copper electroplating process for semiconductor applications," Technical Data Sheet from Enthone (2009), the contents of which are hereby incorporated by reference.

Figure 5:
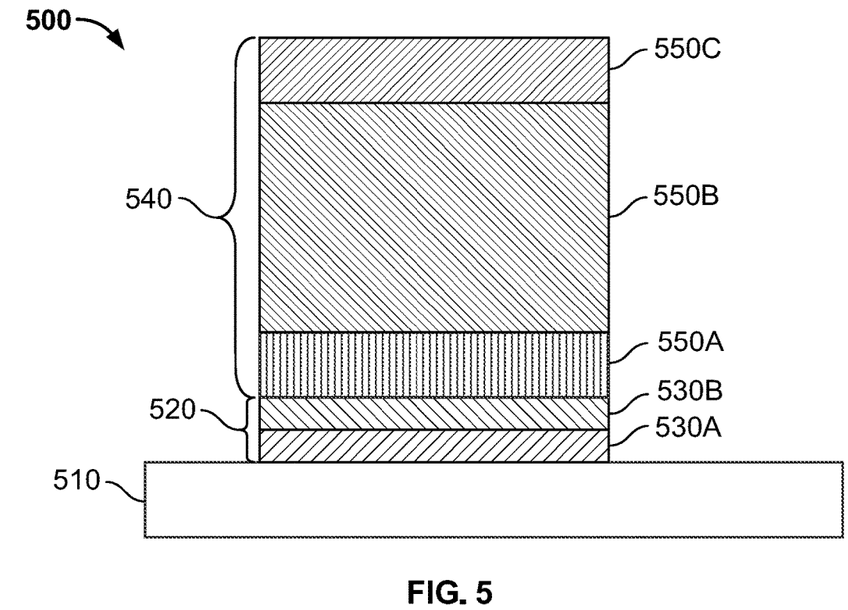
FIG. 5 illustrates a cross-sectional view of an overall electrical trace in accordance with one or more embodiments of the present invention.

FIG. 5 illustrates a cross-sectional view of an overall electrical trace 500 in accordance with one or more embodiments of the present invention. The electrical trace 500 includes two layers formed on a substrate 510. The first layer is a seed layer 520, formed by the AJP 100, and preferably having at least two seed sub-layers 530A, 530B formed by at least two corresponding passes of the AJP 100 during the printing of the seed layer 520. The second layer of the electrical trace 500 is a plating layer 540 formed during the electrodeposition process 400. As will be discussed below, the plating layer 540 may have one, two, or three plating sublayers 550A-550C, depending upon the number of biases employed during the electrodeposition process 400. In certain embodiments of the present invention, a topcoat of nickel (not illustrated) may be electrodeposited on the top of the plating layer 540. This topcoat of nickel prevents oxidation of the plating layer 540 when the plating layer 540 includes copper.

Figure 6:
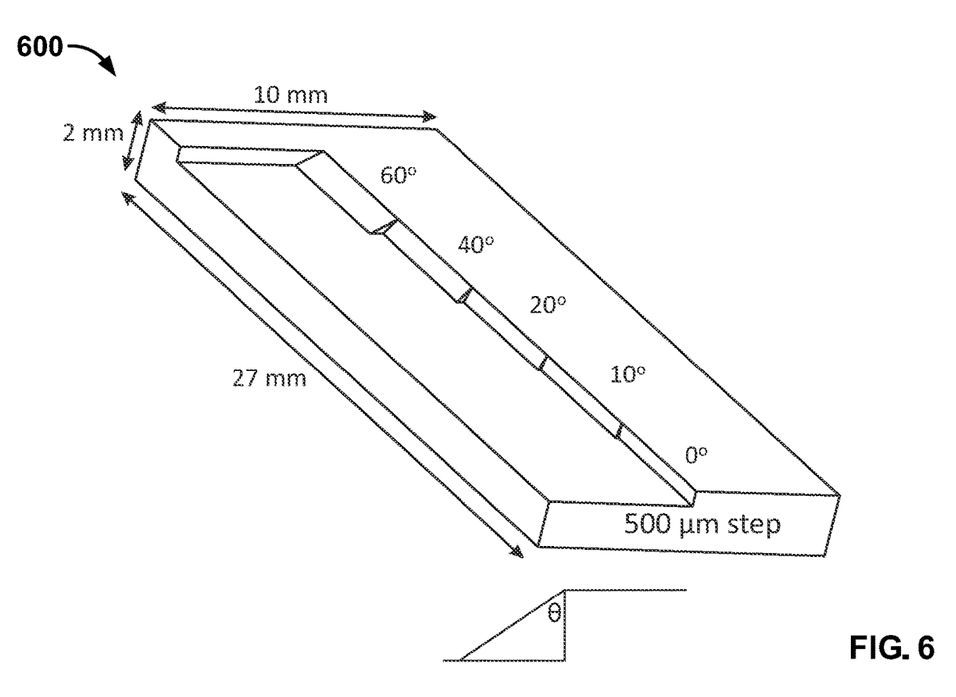
FIG. 6 illustrates a first sample used to demonstrate the robustness of the overall printing process in accordance with one or more embodiments of the present invention.

The effectiveness of the electrodeposition process 400 as a function of bias was tested using a sample 600 with a 500 μm step at various angles. The sample 600 and its various angles are illustrated in FIG. 6. The sample 600 first received a series of three or four electrical traces on each of the various angles printed using the AJP 100 and corresponding process described above. The electrical traces were formed of two printed layers. The sample was next subjected to a bias of −0.3 V from the potentiostat 440 for sixty seconds. This relatively low bias was employed to form a relatively dense electrodeposited layer. As shown in Table 1 below, some of the resultant electrical traces for the shallower angles (60° and 40°) bridged the gap from the top to the bottom of the sample 600. Because many of the electrical traces were not able to bridge the gap from the top to the bottom of the sample 600, the sample 600 was subjected to a second electrodeposition process 400 at a greater bias of −0.75 V from the potentiostat 440 for an additional 30 seconds. As shown in Table 1 below, some additional electrical traces were able to bridge the gap from the top to the bottom of the sample 600. As can be observed, the electrical traces that bridged the gap with just the −0.3 V bias had a lower resistance or higher conductivity than did those that bridged the gap only after application of the second, higher −0.75 V bias. This lower resistance or higher conductivity is attributed to the higher density of the electrodeposited layer that bridged the gap in these lower bias electrical traces. The resistance of the higher density electrical traces approaches a factor of ten less than the resistance of the lower density electrical traces, showing that density has a significant impact on resistance and thus conductivity.

TABLE 1

Summary of Gap Bridging and Resistance as a Function of Electrodeposition Bias

| Angle | No Step | 60° | | | | 40° | | |
|---|---|---|---|---|---|---|---|---|
| Bridged at −0.3 V? | Y | Y | Y | N | N | Y | Y | N |
| Bridged at −0.75 V? | | | | Y | Y | | | Y |
| Resistance | 0.36 Ω | 0.46 Ω | 0.59 Ω | 5.04 Ω | 3.57 Ω | 0.78 Ω | 0.43 Ω | 0.40 Ω |

The step was too great at 0°, 10°, and 20° for the electrodeposited layer on the electrical traces to bridge the gap from the top to the bottom of the sample 600, and thus their results are not included in Table 1.

In applications where the electrical traces will need to bridge a gap, in one embodiment of the present invention a greater bias is used in a first phase of the electrodeposition process to bridge the gap, thereby forming a first plating sub-layer. This greater bias electrodeposition phase is followed by a second phase of the electrodeposition process at a reduced bias. By using a reduced bias, a denser layer of the electrodeposition material, i.e., a second plating sub-layer, is formed that will have a higher conductivity than if only the greater bias is used. In certain embodiments of the present invention, these two phases may be reversed with the lower bias used to produce a denser first plating sub-layer followed by a higher bias phase to produce a gap bridging second plating sub-layer. In yet another embodiment of the present invention, in a first phase, a low bias is used initially to form a dense, high conductivity first plating sub-layer on the underlying contacts. This initial low bias is followed by a greater bias in a second phase to form a less dense second plating sub-layer that will bridge any gaps. This greater bias is then followed by a third phase, again using a low bias, to form another dense and highly conductive third plating sub-layer. This three phase process should result in a highly conductive electrical trace, but also one that has good gap bridging properties.

Figure 7A:
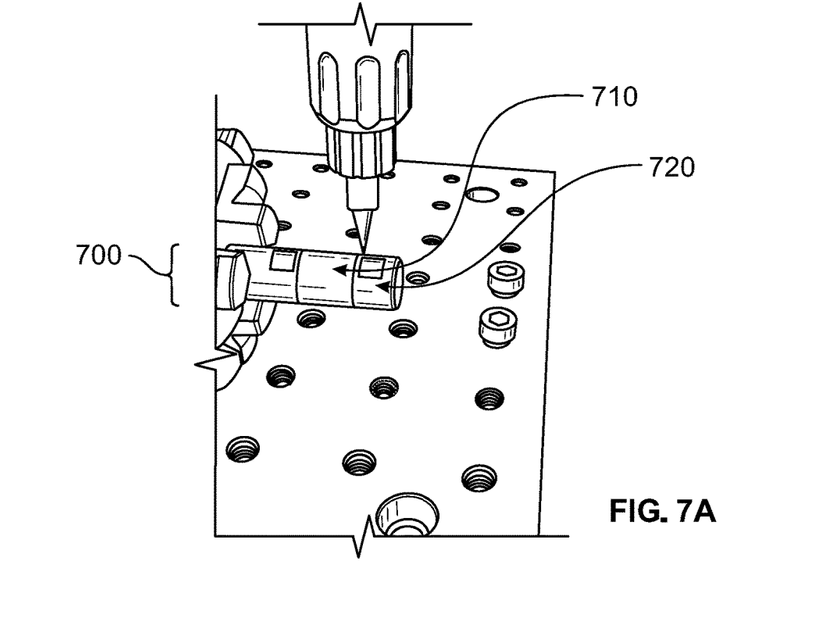
FIGS. 7A-7B illustrate a second sample used to demonstrate the robustness of the overall printing process in accordance with one or more embodiments of the present invention.
Figure 7B:
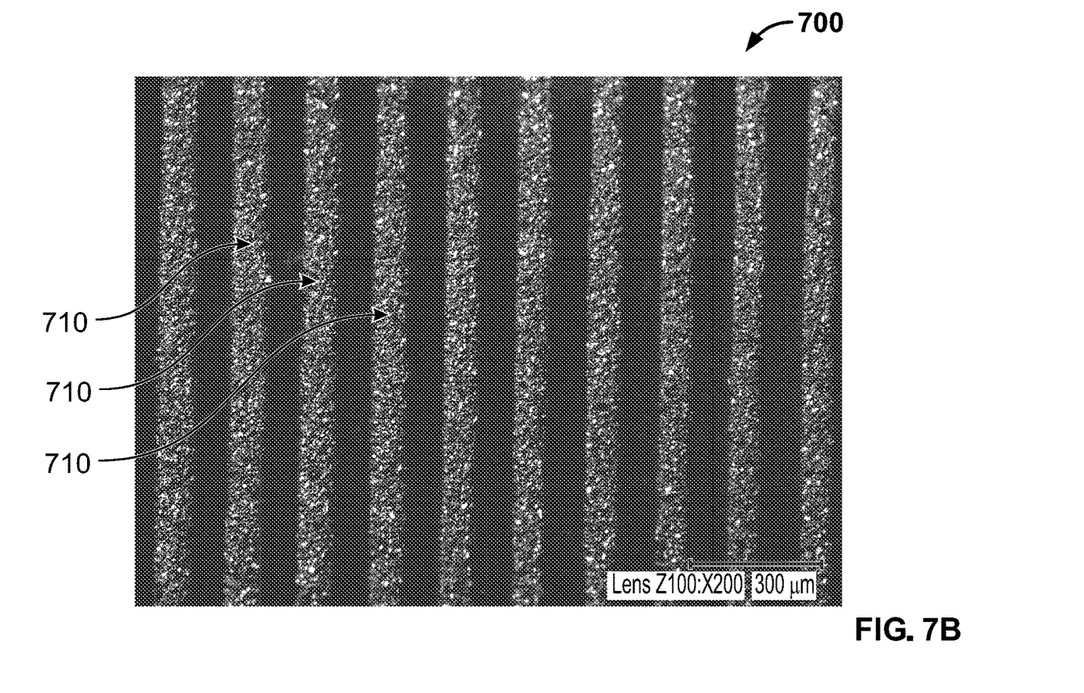

In a second experiment exploring the robustness of the electrodeposition process 400, a silver-based electrical trace 710 in the form of a coil was printed using the AJP 100 on a glaze coated ceramic cylinder 720 as part of a miniature transformer 700, illustrated in FIG. 7A. FIG. 7B illustrates a close-up of a portion of the electrical trace 710 after having undergone a three hour copper-based electrodeposition process 400. The resultant electrical trace 710 has a thickness of approximately 8 μm. This experiment showed that an electrical trace 710 having high conductivity can be formed on a far from planar surface as the ceramic cylinder 720 had a diameter of 9.5 mm.

Figure 8A:
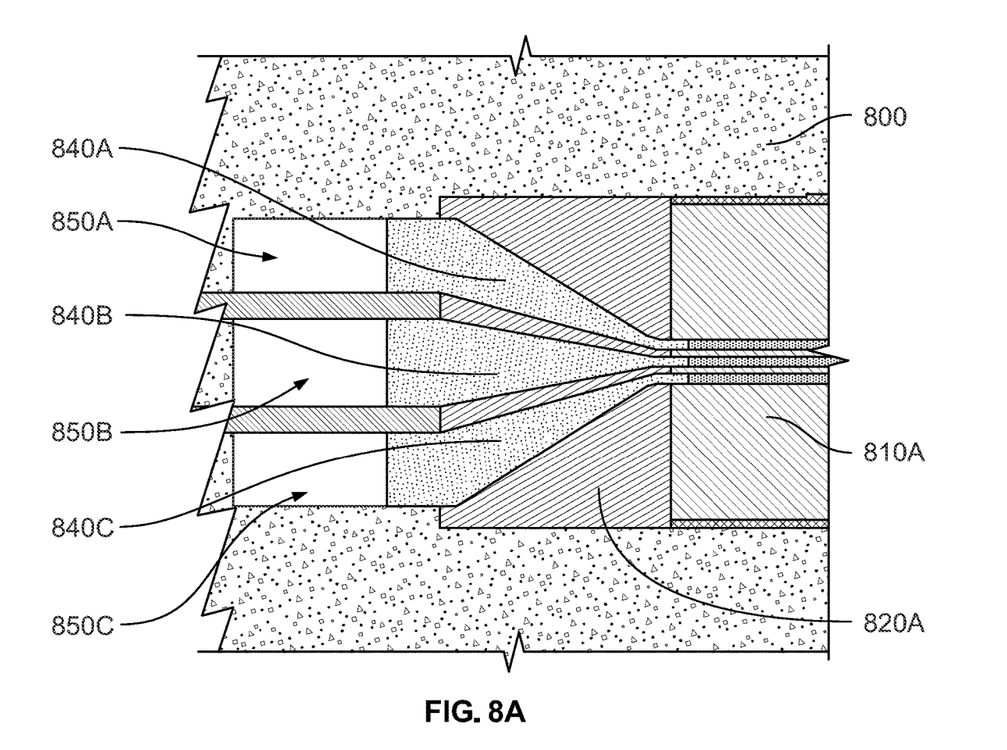
FIGS. 8A-8D illustrate an application of the overall printing process in accordance with one or more embodiments of the present invention.
Figure 8B:
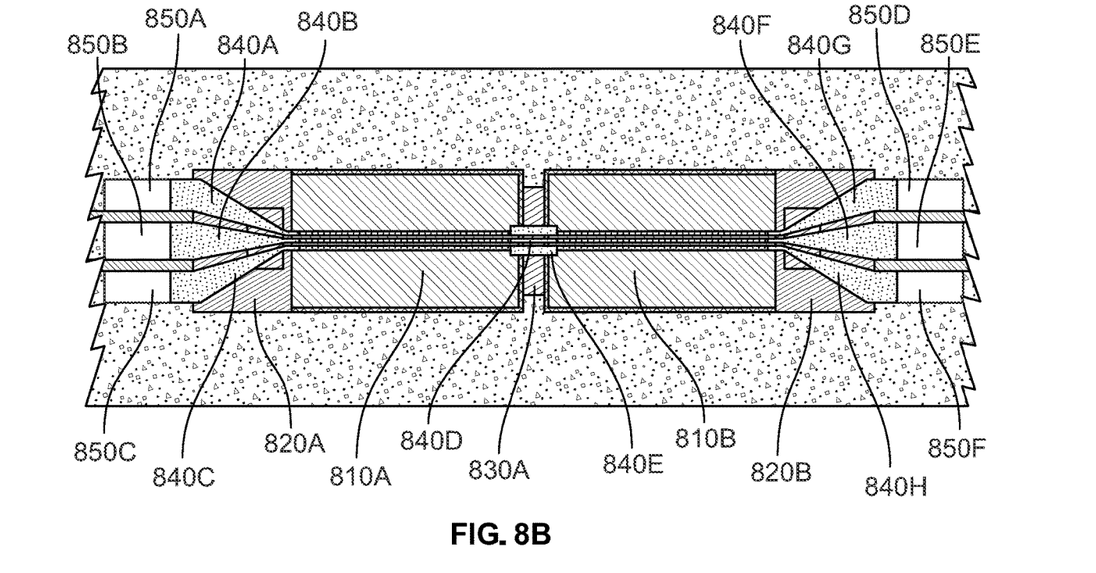
Figure 8C:
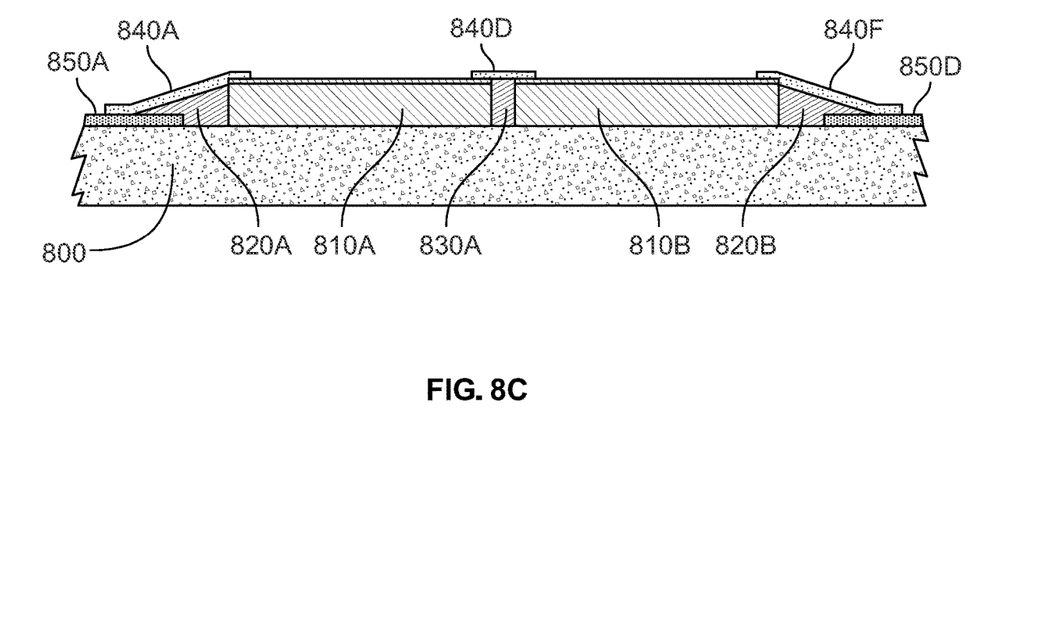

As shown in FIGS. 7A and 7B, various embodiments of the present invention may find application in the fabrication of miniature transformers. Various embodiments of the present invention may also find application when combining different technologies. As an example, a substrate may serve as a motherboard or PCB with various integrated circuits mounted thereto. FIGS. 8A-8D illustrate such an example in which one or more monolithic microwave integrated circuits (MMICs) 810A, 810B, are surface mounted to a substrate 800. As illustrated in FIGS. 8A-8C, dielectric ramps 820A, 820B are printed on the surface of the substrate 800 to form a smooth transition between the surface of the substrate 800 and the surface of the MMICs 810A, 810B. As noted above, these dielectric ramps 820A, 820B may be printed using the AJP 100 with a dielectric-based ink formulation. A dielectric bridge 830A may also be printed between the MMICs 810A, 810B as illustrated in FIGS. 8B and 8C. The AJP 100 may then be used, with a change to a conductive ink formulation, to print electrical traces 840A-840J, in accordance with one or more embodiments of the present invention. The printed electrical traces 840A-840C are used to electrically interconnect the MMIC 810A with existing substrate electrical traces 850A-850C on the substrate 800. The printed electrical traces 840D, 840E are used to electrically interconnect the MMICs 810A, 810B. A second set of printed electrical traces 840F-840H are used to electrically interconnect MMIC 810B with existing substrate electrical traces 850D-850F on the substrate 800. After the electrical traces 840A-840H are printed using the AJP 100, the overall structure is subjected to the electrodeposition process 400 described above with reference to FIG. 4.

Figure 8D:
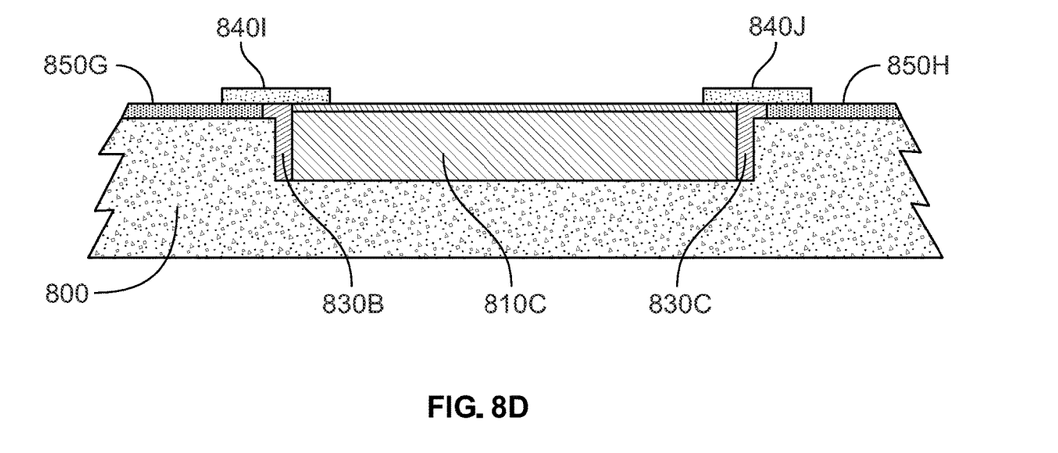

FIG. 8D illustrates the case when an MMIC 810C is mounted in a well or recess formed in the surface of the substrate 800. As with the case illustrated in FIGS. 8A-8C, the case illustrated in FIG. 8D requires printing of bridges 830B, 830C to bridge the gap between the MMIC 810C and the substrate 800. As before, these bridges 830B, 830C may be printed with the AJP 100 using a dielectric-based ink formulation. The electrical traces 840I, 840J are subsequently printed to electrically interconnect the MMIC 810C with existing substrate electrical traces 850G, 850H on the substrate 800. After the electrical traces 840I, 840J are printed using the AJP 100, the overall structure is subjected to the electrodeposition process 400 described above with reference to FIG. 4.

Various embodiments of the present invention can be used to form a number of devices and the interconnects between the devices. Among the devices are sensors, printed electronics, and energy storage devices, while enabling the heterogeneous integration of these and other devices. To date, the various embodiments of the present invention have been employed to form transformers, with radio frequency (RF) interconnects and antennas, capacitors, micro-inductors, die repair, real-time sensors, electrode printing, embedded traces, and resistive traces planned in the future.

One or more embodiments of the present invention offer a number of benefits. These benefits include high resolution and accuracy due to the underlying high resolution and accuracy of the aerosol jet printing process used to form the seed layers and can do so with a variety of materials. Fundamental features sizes from 10 to 100 µm can be printed directly with the AJP 100, while even larger feature sizes can be printed using the CNC-controlled translation stage 160. Unlike other three-dimensional (3D) printers, the AJP 100 is not subject to issues associated with overspray. Overspray, for example, a non-confined ink deposition, is especially problematic with interconnects shorting or losses with RF antennas. Various embodiments of the present invention also offer the benefit of high conductivity, very low loss electrical traces with typical resistance of less than 1 Ω.

In spite of these various benefits of one or more embodiments of the present invention, one problem not solved by the above discussed embodiments is the issue that arises when the integrated circuits or the substrate are not aligned with each other. For example, a mounted integrated circuit 810 may be offset or rotated relative to its expected position on the substrate 800. Similarly, the substrate 150 may be offset or rotated relative to its expected position on the CNC-controlled translation stage 160 of the AJP 100.

To overcome this alignment issue, one or more embodiments of the present invention include an automated method to deposit an interconnect joining two components with well-defined conductor positions but with arbitrary and independent rotation and translation relative to the CNC-controlled translation stage 160 of the AJP 100. This automated method enables the printing of interconnect components with looser tolerances on how two parts can be placed and oriented relative to the substrate.

Figure 9:
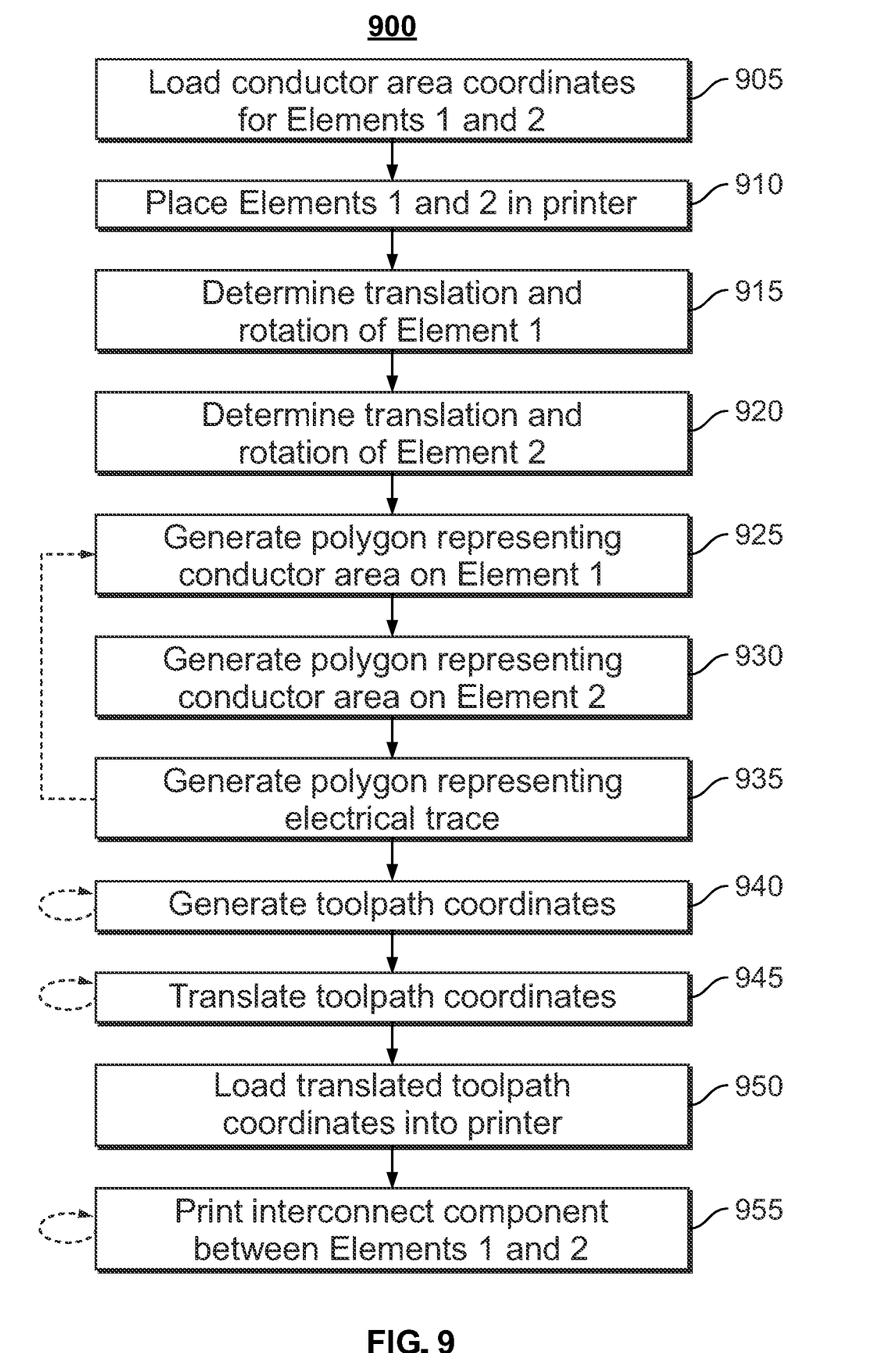
FIG. 9 is a flowchart illustrating an automated alignment method in accordance with one or more embodiments of the present invention.

FIG. 9 illustrates, in flowchart form, an embodiment of an automated alignment method 900 in accordance with one or more embodiments of the present invention. In step 905, coordinates representing outlines of multiple conductor areas relative to an origin on each component is loaded for Element 1 and Element 2. Element 1 and Element 2 may both be integrated circuits, or one may be an integrated circuit while the other is a substrate. The conductor areas may correspond, for example, to electrical pins or leads on an integrated circuit or preexisting electrical traces on an integrated circuit or substrate. It is desired that electrical traces be formed between the conductor areas for Element 1 and corresponding conductor areas for Element 2. In step 910, Element 1 and Element 2 are placed on a translation stage for the printer.

In step 915, a camera having a known offset from the translation stage is used to determine the translation dX1 and dY1 and the rotation R1 of Element 1. This determination may be made using, for example, the edges of, or fiducial marks on, Element 1. In step 920, the camera is used to determine the translation dX2 and dY2 and the rotation R2 of Element 2. This determination may be made using, for example, the edges of, or fiducial marks on, Element 2.

In step 925, a polygon representing a pad on top of a first conductor area on Element 1 is generated. In step 930, a polygon representing a pad on top of a corresponding first conductor area on Element 2 is generated. In step 935, a polygon representing an electrical trace between the polygons of step 925 and 930 is generated. Steps 925, 930, and 935 are repeated for each of the conductor areas on Element 1 and Element 2. Each triplet of corresponding polygons will be used to form a physical, electrical interconnect component between corresponding conductor areas.

In step 940, a set of coordinates representing points a toolpath will visit for a perimeter and infill of a first interconnect component are generated. The user can customize the toolpath including infill density, infill spacing, and the distance of the infill from the perimeter. Step 940 is repeated for each interconnect component between corresponding conductor areas. In step 945, the set of coordinates for each toolpath are translated into a format compatible with the printer. Step 945 is repeated for each interconnect component between corresponding conductor areas. In step 950, the translated coordinates are loaded into the printer. In step 955, the printer prints a first interconnect component between Element 1 and Element 2 using a conductive ink. Step 955 is then repeated for each interconnect component.

Figure 10:
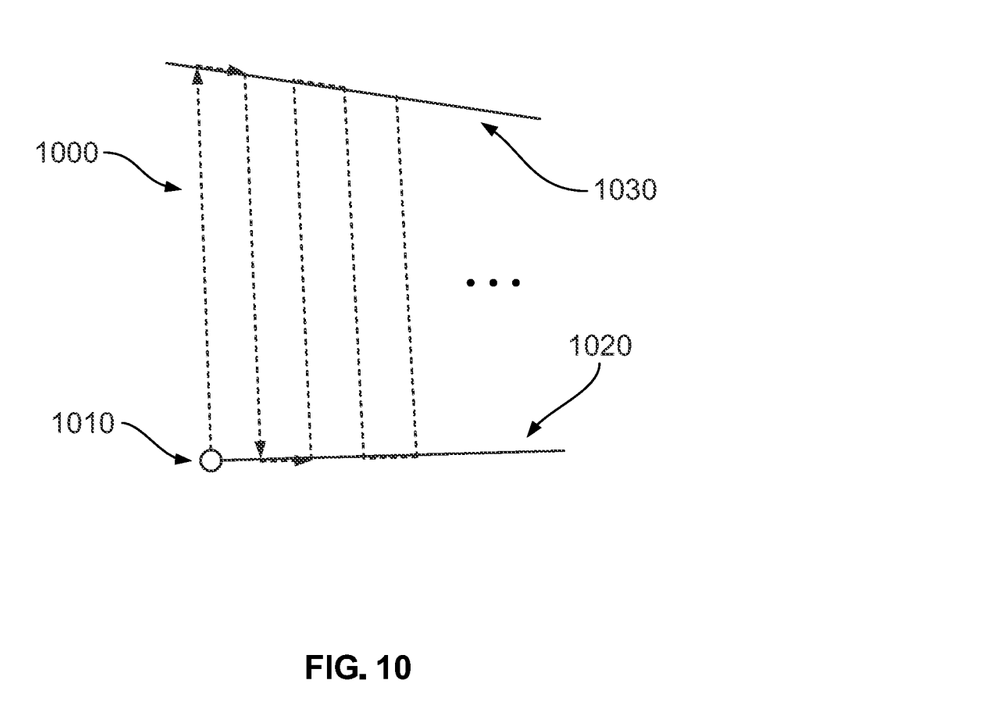
FIG. 10 illustrates a toolpath generated in accordance with one or more embodiments of the present invention.

FIG. 10 illustrates an example of a toolpath 1000 that may be generated in step 940. The toolpath 1000 includes a starting point 1010 along a lower boundary 1020 for a given interconnect component. The given interconnect component also includes an upper boundary 1030. The toolpath 1000 starts at the starting point 1010, traverses to the upper boundary 1030 in a straight line, travels a distance along the upper boundary 1030, traverses to the lower boundary 1020 in a straight line, and then travels a distance along the lower boundary 1020. This serpentine path is then repeated until the toolpath 1000 covers the entire interconnect component. The toolpath 1000 illustrated in FIG. 10 is serpentine in nature, though other toolpath configurations, for example a spiral when the interconnect component is substantially circular, may be employed in other embodiments of the present invention.

While the automated alignment method 900 described above with reference to FIG. 9 was used for printing interconnect components, in other embodiments of the present invention, a similar automated alignment method may be employed to write dielectric ramps, for example, dielectric ramps 820A, 820B, or dielectric bridges, for example, 830A, 830B, 830C using a dielectric-containing ink. In yet other embodiments of the present invention, a similar automated alignment method may be employed to write magnetic elements using, for example, a ferroelectric-containing ink. In still other embodiments of the present invention, a similar automated alignment method may be employed to write various elements using ceramic-containing, monomer-containing, or polymer-containing inks.

In other embodiments of the present invention, electrical traces or other electrical elements may be printed on a printing substrate using AJP with a conductive ink. The printing substrate may be, for example, glass or Kapton, while the conductive ink may include, for example, silver, copper, or gold. The printed electrical traces or other electrical elements are then subjected to an electrodeposition process to increase their conductivity. The electrodeposition process may use an electrolyte including, for example, silver, copper, nickel, or gold. The printed electrical traces or other electrical elements are then removed from the printing substrate and may either be freestanding elements or transferred to another substrate depending upon the application.

The printed electrical traces or other electrical elements may be removed from the printing substrate using, for example, tape. If the electrical traces or other electrical elements are coiled, they may be stretched and deformed, indicating their flexibility. Resistances measured before and after removal from the printing substrate are similar. These embodiments may be used to create printed ribbon connection structures or other freestanding metal components. Potential applications include, for example, flexible hybrid electronics (FHE), wearable electronics, bio-sensors, automotive, and mobile devices.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A device comprising:
   an electrical trace, the electrical trace including:
      a seed layer, the seed layer formed by an aerosol jet printing (AJP) process, the seed layer including at least two seed sub-layers, each of the at least two seed sub-layers formed by a corresponding AJP process; and
      a plating layer, the plating layer formed by an electrodeposition process.

2. The device of claim 1, wherein the AJP process uses a conductive ink including one or more of silver, copper, or gold.

3. The device of claim 2, wherein the AJP process uses a conductive ink including silver.

4. The device of claim 1, wherein the electrodeposition process uses an electrolyte including one or more of silver, copper, nickel, or gold.

5. The device of claim 4, wherein the electrodeposition process uses an electrolyte including copper.

6. A method for forming an electrical trace on a surface, the method comprising the steps of:
   forming a seed layer on the surface, the seed layer formed using an aerosol jet printing (AJP) process, the seed layer including at least two seed sub-layers, each of the at least two seed sub-layers formed by a corresponding AJP process; and
   forming a plating layer on the seed layer, the plating layer formed using an electrodeposition process.

7. The method of claim 6, wherein the AJP process uses a conductive ink including one or more of silver, copper, or gold.

8. The method of claim 7, wherein the AJP process uses a conductive ink including silver.

9. The method of claim 6, wherein the electrodeposition process uses an electrolyte including one or more of silver, copper, nickel, or gold.

10. The method of claim 9, wherein the electrodeposition process uses an electrolyte including copper.

11. The method of claim 6,
    wherein the plating layer includes a single plating sub-layer; and
    wherein the electrodeposition process forming the single plating sub-layer uses a voltage adapted to form a dense single plating sub-layer.

12. The method of claim 6,
    wherein the plating layer includes a single plating sub-layer; and
    wherein the electrodeposition process forming the single plating sub-layer uses a voltage adapted to form a gap bridging single plating sub-layer.

13. The method of claim 6,
    wherein the plating layer includes a first plating sub-layer and a second plating sub-layer, the second plating sub-layer formed on the first plating sub-layer;
    wherein the electrodeposition process forming the first plating sub-layer uses a voltage adapted to form a dense first plating sub-layer; and
    wherein the electrodeposition process forming the second plating sub-layer uses a voltage adapted to form a gap bridging second plating sub-layer.

14. The method of claim 6,
    wherein the plating layer includes a first plating sub-layer and a second plating sub-layer, the second plating sub-layer formed on the first plating sub-layer;
    wherein the electrodeposition process forming the first plating sub-layer uses a voltage adapted to form a gap bridging first plating sub-layer; and
    wherein the electrodeposition process forming the second plating sub-layer uses a voltage adapted to form a dense second plating sub-layer.

15. The method of claim 6,
    wherein the plating layer includes a first plating sub-layer, a second plating sub-layer, and a third plating sub-layer, the second plating sub-layer formed on the first plating sub-layer, the third plating sub-layer formed on the second plating sublayer;
    wherein the electrodeposition process forming the first plating sub-layer uses a voltage adapted to form a dense first plating sub-layer;
    wherein the electrodeposition process forming the second plating sub-layer uses a voltage adapted to form a gap bridging second plating sub-layer; and
    wherein the electrodeposition process forming the third plating sub-layer uses a voltage adapted to form a dense third plating sub-layer.

16. A method for forming an electrical trace between two electronic devices, the method comprising the steps of:
    providing a first electronic device and a second electronic device;
    determining a first translation and a first rotation of the first electronic device;
    determining a second translation and a second rotation of the second device;
    generating a first polygon corresponding to a first conductor area of the first electronic device;
    generating a second polygon corresponding to a second conductor area of the second electronic device;
    generating a third polygon connecting the first polygon to the second polygon;
    generating toolpath coordinates based upon a combination of the first polygon, the second polygon, and the third polygon;
    translating the toolpath coordinates;
    forming a seed layer based upon the thus translated toolpath coordinates, the seed layer formed using an aerosol jet printing (AJP) process; and
    forming a plating layer on the seed layer, the plating layer formed using an electrodeposition process.

17. The method of claim 16, wherein each of the first electronic device and the second electronic device is an integrated circuit or a substrate.

18. The method of claim 16, wherein the step of translating includes translating the toolpath coordinates from a first coordinate system into a format compatible with an aerosol jet printer employed in the step of forming the seed layer.

\* \* \* \* \*